United States Patent
Hartl

(10) Patent No.: US 11,398,732 B2
(45) Date of Patent: Jul. 26, 2022

(54) POWER SUPPLY SYSTEM AND TRACKED VEHICLE

(71) Applicant: XELECTRIX POWER GMBH, Mauthausen (AT)

(72) Inventor: Alexander Hartl, Leonding (AT)

(73) Assignee: XELECTRIX POWER GMBH, Mauthausen (AT)

( * ) Notice: Subject to any disclaimer, the term of this patent is extended or adjusted under 35 U.S.C. 154(b) by 378 days.

(21) Appl. No.: 16/630,084

(22) PCT Filed: Jul. 19, 2018

(86) PCT No.: PCT/AT2018/000065
§ 371 (c)(1),
(2) Date: Jan. 10, 2020

(87) PCT Pub. No.: WO2019/014691
PCT Pub. Date: Jan. 24, 2019

(65) Prior Publication Data
US 2020/0212680 A1    Jul. 2, 2020

(30) Foreign Application Priority Data
Jul. 20, 2017  (AT) .................................. A 304/2017

(51) Int. Cl.
*H02J 3/38* (2006.01)
*H02S 10/10* (2014.01)
(Continued)

(52) U.S. Cl.
CPC .............. *H02J 3/381* (2013.01); *B62D 55/06* (2013.01); *H01L 35/30* (2013.01); *H02J 7/35* (2013.01);
(Continued)

(58) Field of Classification Search
CPC ...... H02J 3/381; H02J 3/38; H02J 7/35; H02J 2300/26; H02S 10/10; H02S 10/20;
(Continued)

(56) References Cited

U.S. PATENT DOCUMENTS

| 2003/0048006 A1 | 3/2003 | Shelter, Jr. et al. |
| 2004/0084965 A1 | 5/2004 | Welches et al. |

(Continued)

FOREIGN PATENT DOCUMENTS

| CN | 204407990 U   | 6/2015 |
| DE | 102012023426 A1 | 3/2014 |
| EP |   2988387 A1  | 2/2016 |

OTHER PUBLICATIONS

International Preliminary Report on Patentability dated Oct. 16, 2019 issued in corresponding International Patent Application No. PCT/AT2018/000065 (16 pgs.).

(Continued)

*Primary Examiner* — Robert L Deberadinis
(74) *Attorney, Agent, or Firm* — Pillsbury Winthrop Shaw Pittman, LLP

(57) ABSTRACT

In a power supply system comprising an electric generator, a DC intermediate circuit, at least one rechargeable electrical energy storage, which is connected to the DC intermediate circuit, a rectifier via which the electrical generator is connectable to the DC intermediate circuit, and at least a first inverter, the DC side of which is supplied with direct current from the DC intermediate circuit and the AC side of which is connectable to an electrical load, and further comprising a control device which regulates the generator in dependence on the load of the electrical load, it is provided that the control device is designed to switch between a first and a second operating mode of the power supply system, wherein in the first operating mode the electrical energy generated by the electrical generator is supplied via the rectifier to the DC (Continued)

Figure 1:
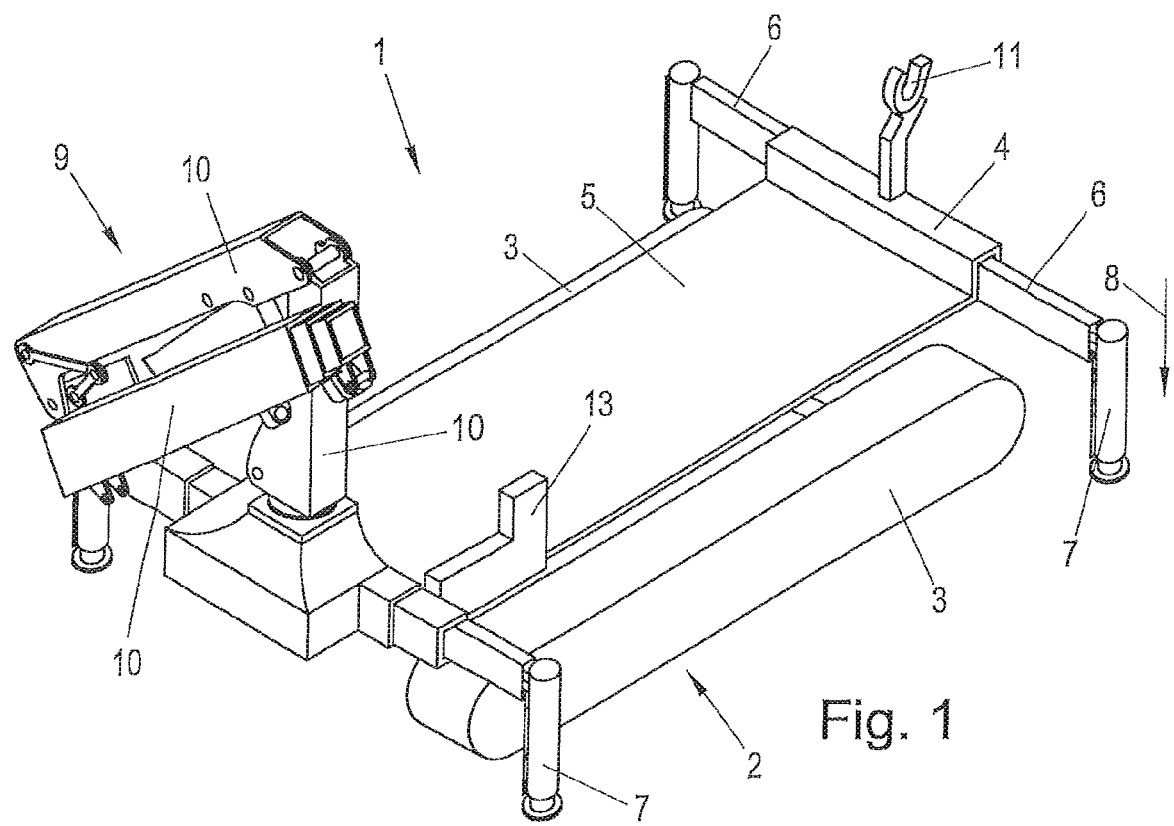

intermediate circuit, and in the second operating mode the generator is connected to the load in parallel with the inverter.

15 Claims, 3 Drawing Sheets

(51) Int. Cl.
| | | |
|---|---|---|
| *H02S 10/20* | (2014.01) | |
| *B62D 55/06* | (2006.01) | |
| *H01L 35/30* | (2006.01) | |
| *H02J 7/35* | (2006.01) | |
| *H02J 9/06* | (2006.01) | |
| *B60P 1/54* | (2006.01) | |
| *B60S 9/02* | (2006.01) | |
| *B66C 23/42* | (2006.01) | |
| *B66C 23/78* | (2006.01) | |

(52) U.S. Cl.
CPC ............... *H02J 9/06* (2013.01); *H02S 10/10* (2014.12); *H02S 10/20* (2014.12); *B60P 1/5423* (2013.01); *B60S 9/02* (2013.01); *B66C 23/42* (2013.01); *B66C 23/78* (2013.01); *B66C 2700/0364* (2013.01); *H02J 2300/26* (2020.01)

(58) Field of Classification Search
CPC ....... B62D 55/06; H01L 35/30; B60P 1/5423; B60P 1/54; B60S 9/02; B66C 23/42; B66C 23/78; B66C 2700/0364
See application file for complete search history.

(56) References Cited

U.S. PATENT DOCUMENTS

| | | |
|---|---|---|
| 2011/0001361 A1 | 1/2011 | Appel |
| 2014/0021721 A1 | 1/2014 | Barton et al. |
| 2014/0032006 A1 | 1/2014 | Tojima et al. |
| 2015/0270744 A1 | 9/2015 | Lacarnoy |
| 2015/0354322 A1 | 12/2015 | Vicknair et al. |
| 2016/0248263 A1* | 8/2016 | Hunt .................. H02J 3/32 |
| 2017/0093162 A1 | 3/2017 | Inoue |
| 2017/0179759 A1 | 6/2017 | Johansen |

OTHER PUBLICATIONS

Search Report and Written Opinion of the International Searching Authority dated Sep. 27, 2018 issued in corresponding International Patent Application No. PCT/AT2018/000065 (12 pgs.).

* cited by examiner

POWER SUPPLY SYSTEM AND TRACKED VEHICLE

CROSS-REFERENCE TO RELATED APPLICATIONS

This application is the U.S. National Stage of PCT/AT2018/000065, filed Jul. 19, 2018, which claims priority to: Austrian Patent Application No. A304/2017, filed Jul. 20, 2017, the entire contents of each of which are herein incorporated by reference in their entireties.

The invention relates to a power supply system comprising an electric generator, a DC intermediate circuit, at least one rechargeable electrical energy storage, which is connected to the DC intermediate circuit, a rectifier via which the electrical generator is connectable to the DC intermediate circuit, and at least a first inverter, the DC side of which is supplied with direct current from the DC intermediate circuit and the AC side of which is connectable to an electrical load, and further comprising a control device which regulates the generator in dependence on the load of the electrical load.

The invention further relates to a tracked vehicle comprising a power supply system according to the invention and to the use of such a tracked vehicle.

Power supply systems are known from the prior art, which are used in particular in areas, where no power supply is guaranteed via the power grid, for example on construction sites, in remote areas or when the power supply has failed, in order to supply a variety of devices with electricity autonomously or independently of the grid. These power supply systems essentially have a generator which is driven by an internal combustion engine, in particular a gasoline or diesel engine. The devices to be operated can be connected to the generator and operated thereby.

A disadvantage of the known power supply systems is that in the combustion engines used, the energy value contained in fossil fuels can be converted into electrical energy only to a small extent. This ratio of consumed output energy to electrical energy further deteriorates when the engine can not operate in the optimum power range. Especially on construction sites, however, due to the different consumers usually very different load requirements are given to the power generator.

The low energy conversion efficiency results in a high demand for fuel, which creates deployment efforts and high costs. Furthermore, unnecessarily emissions, in particular exhaust gases are released into the environment.

To counter these disadvantages in part, systems are known from the prior art, in which the generator is connected to a circuit, e.g. a DC intermediate circuit, via a rectifier and thereby supplies an electric energy storage device with power. This makes it possible to operate the generator at the optimum operating point. Furthermore, it is known in such systems to connect further power generation systems, e.g. photovoltaic systems or wind turbines, to the DC intermediate circuit.

A disadvantage of these systems is the limitation of the maximum load by the capacity of the energy storage. The electrical energy storage must therefore be sized relatively large. Furthermore, especially in peak load operation, considerable conversion losses occur due to the interposition of a DC buffer between the generator and the load. As a result, the overall efficiency of the system is significantly reduced.

It is therefore an object to further develop a power supply system of the prior art so that the overall efficiency of power generation is significantly increased. In particular, by increasing the overall efficiency, the emissions released during energy conversion and the operating costs should be significantly reduced.

To solve this problem, the power supply system of the type mentioned initially is substantially further developed such that the control device is designed to switch between a first and a second operating mode of the power supply system, wherein in the first operating mode the electrical energy generated by the electrical generator is, preferably entirely, supplied via the rectifier, in particular a regulated AC/DC converter or an active front end rectifier, to the DC intermediate circuit, wherein preferably the load is supplied via the inverter with electrical energy from the DC intermediate circuit, and in the second operating mode the generator is connected to the load in parallel with the inverter. In the first operating mode, the energy generated by the generator is supplied to the DC intermediate circuit and thus, in particular, to the rechargeable electrical energy storage, and from there via the inverter, if appropriate, to the load. In the first operating mode, the energy generated in the generator is supplied to the DC intermediate circuit and thus in particular to the rechargeable electrical energy storage, and supplied subsequently from there via the inverter to the load if necessary. The first operating mode is used under normal load conditions. In the second operating mode, the generator and the inverter are connected in parallel, so that the load is supplied directly with energy both from the DC intermediate circuit (and the rechargeable electrical energy storage) and the generator. As a result, the output power is greatly increased and peak loads can be compensated in the second operating mode. By providing the possibility of switching between these two modes, it is possible to dimension the generator smaller, since at peak loads the power supply is ensured by the interaction between the generator and DC intermediate circuit rather than the generator or the DC intermediate circuit having to uphold the power supply on their own. As a result, a generator operation is possible, which can largely be in the optimal efficiency range. Furthermore, the generator can also be switched off temporarily, which may be the case, for example, during repair or maintenance work or to avoid noise emissions in inhabited areas. As a result, the power supply of the external load is not interrupted because the electrical energy storage ensures the energy supply.

It is preferably provided that the control device is designed to switch from the first operating mode to the second operating mode, when a limit value of the load is exceeded. This ensures that under normal load, the generator supplies the DC intermediate circuit with power and at high load, the maximum possible output power is achieved by connecting the generator in parallel with the DC intermediate circuit.

Furthermore, it is preferably provided that the rectifier is designed as a bidirectional power converter, with which the control device cooperates in such a way that the bidirectional power converter in the first operating mode is operable as a rectifier and in the second operating mode is operable as a second inverter, the AC side of which is connectable to the load in parallel to the first inverter. By this arrangement, a simple device is provided to ensure a quick and safe switchover.

Furthermore, it is preferably provided that the generator can be driven by an internal combustion engine. The combination of generator and a combustion engine is a long-known and proven way to provide power. In particular, internal combustion engines are characterized by a high mobility and high efficiency. In particular, the generator may be powered by a power take-off of an internal combustion engine driven truck, commercial vehicle or tractor. Alternatively, for driving the generator, for example, gas turbines, steam turbines or other machines, in particular heat engines can be used.

The generator 22 may be formed as an asynchronous or synchronous machine running in generator mode.

In a preferred embodiment it is provided that a thermoelectric generator is connectable to the DC intermediate circuit. As a result, another generator is provided to generate the necessary power.

In this case, it is in particular provided, that the heat energy of the exhaust gas of the internal combustion engine is supplied to the thermoelectric generator. By using the exhaust energy of the internal combustion engine otherwise ineffectively by discharged into the environment, the efficiency of the power supply system can be further increased. By a thermoelectric generator, which preferably consists of several modules, for example, up to 30% of the energy of the exhaust gas can be converted into electrical energy.

In order to further increase the efficiency of the system, it is preferably provided that a photovoltaic system is connectable to the DC intermediate circuit, preferably by means of a DC-DC converter, in particular one operating in MPPT mode (Maximum Power Point Tracking). Photovoltaic systems are a sensible and efficient way of generating electricity, especially in areas with high levels of solar radiation. Due to the sole dependence on solar radiation, no supply of fuel is required for photovoltaic systems, so that the mobility can be increased.

Further, a turbine, in particular a wind turbine can preferably be provided and connectable to the DC intermediate circuit.

Furthermore, it is preferably provided that the control device is designed to monitor the load and based thereon to regulate voltage, current and/or frequency of the power supply system. Such a control device makes it possible to adapt the operating mode of the power supply system to the respectively required load, so that on the one hand the consumer can always be supplied with the required energy and on the other hand an efficient power generation is ensured by the respectively provided power units.

In order to enable a plurality of different operating modes, it is preferably provided that the rectifier and the first inverter are connected in parallel between the DC and AC side and that the generator via a first switching device is connectable to the AC side of the rectifier and that between the AC side of the rectifier and the AC side of the first inverter, a second switching means is provided.

The first switching unit (power contactor) is used herein to connect the generator to the AC side of the rectifier or separate it from the same. The second switching unit is herein arranged between the AC side of the inverter and the AC side of the rectifier (power converter or AC/DC converter). In the first operating mode, the first switching unit is closed and the second switching unit is open, so that the DC intermediate circuit is powered by the generator via the rectifier (power converter or AC/DC converter). In the second operating mode, both the first switching unit and the second switching unit are closed, so that the generator is connected to the load in parallel with the inverter. This structure allows a simple and robust construction of the power supply system.

To be able to supply the load and/or the DC intermediate circuit with external electrical energy, it is preferably provided that the generator, the rectifier and the first inverter are connected via a common matching transformer to a line, via which the load can be supplied with electrical energy and to which, preferably with the interposition of a third switching device, a power supply network is connectable.

In order to be able to disconnect the load from the external power supply network when required, it is preferably provided that the load is connectable to the line with the interposition of a fourth switching device.

A bypass function may preferably be realized in that the AC side of the rectifier between the first switching device and the second switching device is connectable to the line via a line connection that is connected in parallel to the matching transformer, wherein the line connection preferably has a fifth switching device, and wherein preferably the line connection on the load side is separable from the matching transformer by the fourth switching device.

Further according to the invention, a tracked vehicle is provided, comprising a crawler chassis, a power supply system according to the invention, an electric drive for the crawler chassis powered by the power supply system, a transport platform, and a power electronics circuit having at least one three-phase AC terminal for external loads, the transport platform being adapted to receive the power supply system. In such a tracked vehicle it can either be provided that the rechargeable electric energy storage is connected to the power supply system or connected to the tracked vehicle. In the first case, the energy storage is therefore also arranged on the transport platform and in the second case it is an element of the vehicle and is possibly connected to the power supply system. It is preferably provided that a first energy storage is firmly connected to the vehicle and a second energy store is permanently connected to the power supply system.

Tracked vehicle are used on construction sites for various operations. Due to their crawler chassis, tracked vehicles offer high off-road capability and steering stability. Tracked vehicles are usually equipped with a tool required for a specific application, e.g. with a bucket, a crane jib or a demolition hammer. Tracked vehicles are also known, which are equipped with a mounting flange for interchangeable attachment of various attachments, so that such tracked vehicles are versatile. Tracked vehicles also offer the advantage that they are usually self-propelled; wheel-mobile working equipments without their own drive unit, however, always need a corresponding towing vehicle to perform a change of location.

On construction sites usually a variety of different working equipments and work vehicles is needed, these devices or vehicles are rarely used all at the same time, but must be ready for use in each case in a short time. This, as a result of the workflow requirements, brings about an unfavorable ratio between waiting time and actual use of the individual equipments. The working equipments are tied to the site for a long time but are only used for a relatively short time. From an economic point of view, this means that the operation of a construction site requires a high capital investment in relation to the actual work performance. In addition, most working equipments are permanently mounted on work vehicles because they have to be transported to the construction site or moved within the construction site to the respective site, but the respective work is usually performed stationary. The capital investment required for the mobility of such equipment is relatively high in relation to the cost of the working equipment itself.

The invention thus provides a mobile power source which is versatile in use on a construction site. The electrical energy storage, which is preferably designed as an accumulator, serves both to supply its own traction drive and the power supply of external working equipment, which can be connected to the at least one three-phase alternating current connection. In order to ensure an uninterruptible power supply over a long period of time, the tracked vehicle comprises a transport platform for the power supply system according to the invention, which feeds and charges the electrical energy storage.

The power supply system is in this case releasably fastened on the transport platform by means of releasable fastening means, so that the power supply system can be put down at the respective place of use after it has been brought there by the tracked vehicle. The power supply of external working equipment can then be taken over in a conventional manner directly from the separate power supply system and the tracked vehicle gets free for other transport tasks, so that the downtime of the vehicle can be minimized. Furthermore, the tracked vehicle, due to its integrated electrical energy storage, can be temporarily used for the power supply of other working equipment.

To ensure that the transport platform of the tracked vehicle is sufficiently dimensioned for receiving the power supply system, a preferred embodiment provides that the transport platform extends over at least half, preferably over the entire longitudinal extension of the crawler chassis. The length of the transport platform is preferably at least 3.5 m, in particular at least 4 m. The width is preferably at least 1 m, in particular at least 1.5 m.

Further possible uses of the tracked vehicle according to the invention are provided in a preferred development in that a supporting device for trailers and/or a lifting and maneuvering device for roll-off containers is provided. The supporting device for trailers allows use of the tracked vehicle as a towing vehicle for the transport of mobile working equipment, that do not have an own drive. The subject invention makes it possible to transform (wheel) mobile working equipment without their own drive into self-propelled working equipment. The lifting and maneuvering device makes it possible to unilaterally raise a commercial roll-off container, in order to use the tracked vehicle, towing the container in the tilted state, resting on its wheels, and bring it to the desired location.

Preferably, it is further provided that the tracked vehicle carries a loading crane. The loading crane can be used to lift the power supply system onto the transport platform of the tracked vehicle and to set it off from the same again. However, the loading crane can also handle other loads, e.g. mobile or non-mobile working equipment, lift it onto the transport platform to displace or transport the same. In this way, for example, small mobile working equipment, such as small crawler excavators, which can not cover larger distances with their own travel drive, are transported back and forth within large-scale construction sites.

The provision of a loading crane has the advantage that it can replace a truck loading crane, so that the provision of a separate truck can be avoided.

The loading crane is preferably designed as a crane boom with at least two pivotable boom arms. Furthermore, at least one of the boom arms can be designed to be telescopic.

The lifting and maneuvering device for roll-off containers and/or the loading crane are preferably powered with electrical energy by the electrical energy storage of the tracked vehicle for their drive.

The electric drive of the crawler chassis is preferably designed for forward and reverse travel. A preferred embodiment further provides that the drive chains of the crawler chassis are designed to be telescopic in the lateral direction. This allows the track to be adapted to the respective needs.

In order to increase the stability and to reduce the tendency of the tracked vehicle to tilt in the stationary state, it is preferably provided that extendable support feet are provided laterally outside the drive chains of the crawler chassis. The support feet can be displaced laterally and be extended in the laterally outwardly displaced position against the ground, whereby the vehicle is raised.

With regard to the charging of the electrical energy storage it is preferably provided that the charging circuit is designed to charge the electrical energy storage either from the power supply system or from the grid. The charging circuit ensures that the charging current is kept within the optimum range. As a result, on the one hand, it can be prevented that the energy storage device is damaged by the charging current being too high, and, on the other hand, that the energy storage device is deeply discharged, thereby destroying the accumulator cells. The charging circuit allows a network mode in which the electrical energy storage is charged with mains power, as well as a generator mode in which the charging takes place by the connected power supply system.

The tracked vehicle preferably comprises a remotely controllable control device which controls the electric drive, possibly a crane drive, possibly the drive of the lifting and maneuvering device for roll-off containers, possibly the drive of the extendable support feet and possibly the drive for telescoping the drive chains. The remote control can thus be used to carry out preferably wireless control of the most important functions of the vehicle, the vehicle having a data transmission module for wireless data transmission for this purpose, and a remote control is provided which likewise has a data transmission module for wireless data transmission. With the remote control it is possible according to a preferred embodiment to control the traction of the crawler in two directions (forward/backward), the adjustment of the track of the crawler chassis, the raising and lowering of lifting and maneuvering device for roll-off containers and the extension and retraction of the support feet. The remote control of the possibly provided crane can also be performed with the help of its own remote control.

With regard to the remote controllability, the tracked vehicle may preferably be formed without a cab or driver's cab.

The tracked vehicle according to the invention allows novel, efficiency-enhancing work processes on the construction site, in particular a construction site, on which lumpy material is processed, in particular comminuted, classified and/or sorted. The working equipment directly supplied by the vehicle or its electrical energy storage or by the power supply system therefore comprise e.g. rock crushers, classifying and sorting devices as well as conveyor belts, as well as generally electrically operated working equipment.

The invention therefore also relates to the use of a tracked vehicle according to the invention for transporting a power supply system to a load, in particular a working equipment. At the consumer, the power supply system can be set down with the help of the loading crane at the working equipment and the power supply system can be used to power the working equipment. Alternatively, the power supply system can remain on the transport platform of the vehicle and supplies the electrical energy storage with electrical energy, which in turn supplies the working equipment with electrical energy.

Furthermore, it can bee proceeded so that the supporting device for trailers and/or the lifting and maneuvering device for roll-off container is used after setting down of the power supply system to transport a roll-off container or a working equipment.

Furthermore, a working equipment can be lifted and transported to the transport platform after setting down of the power supply system by means of the loading crane.

The invention will be explained in more detail with reference to an embodiment schematically illustrated in the drawing.

Figure 2:
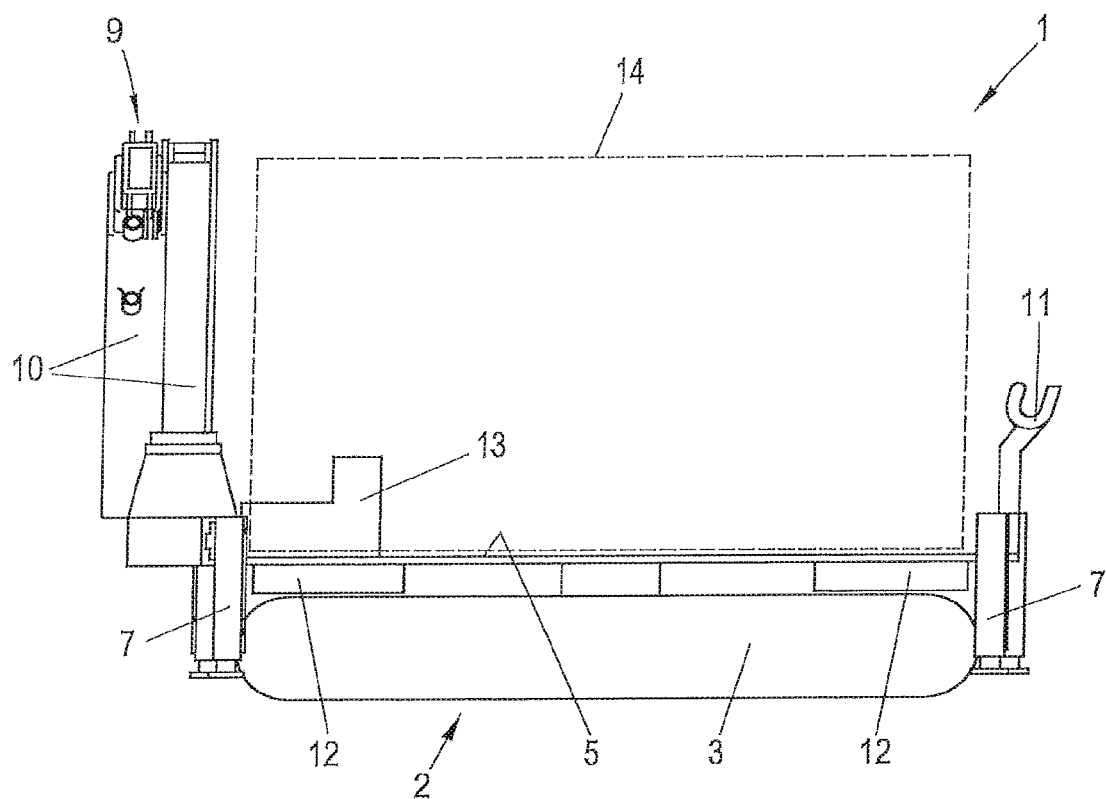
Figure 3:
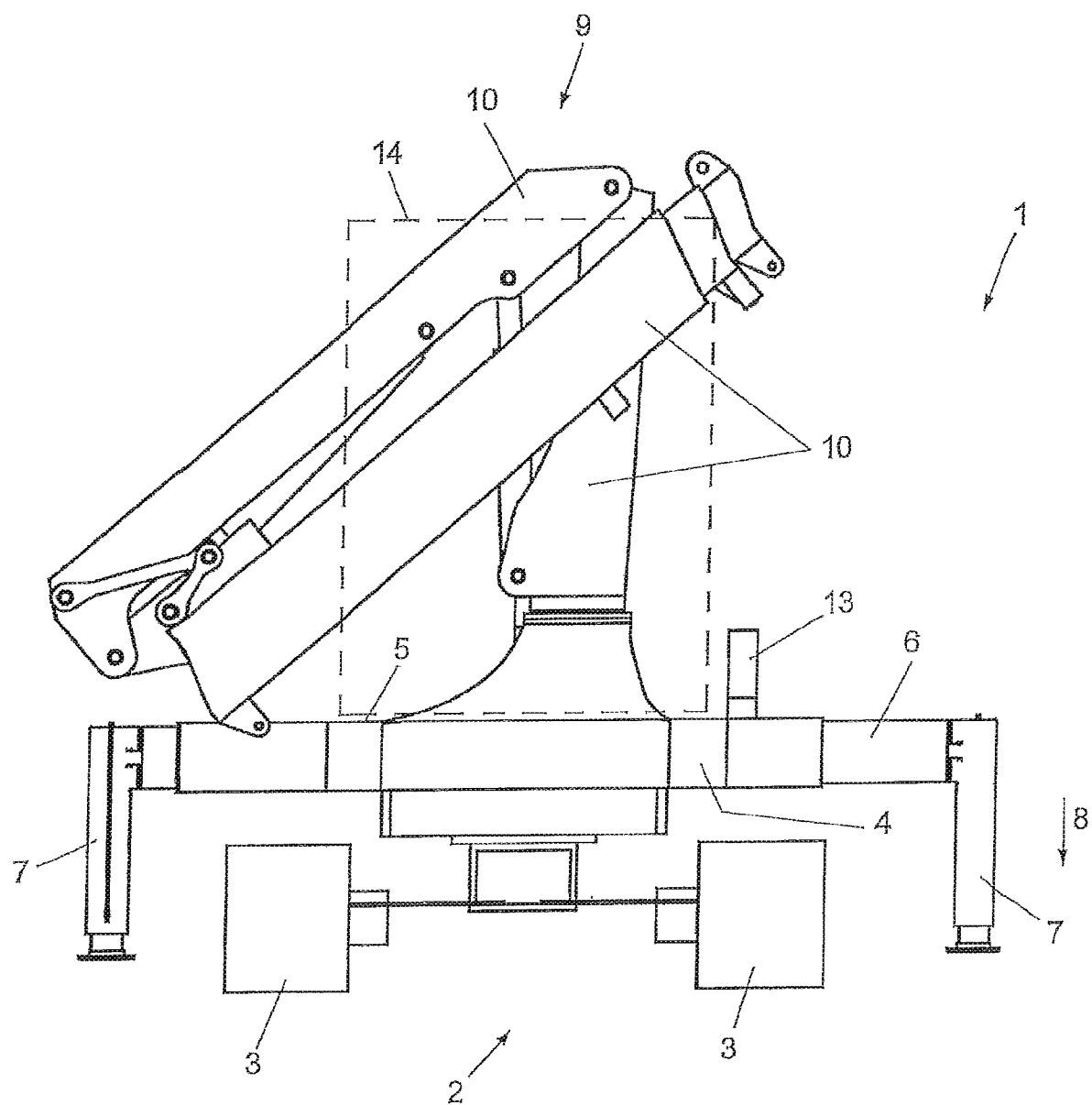
Figure 4:
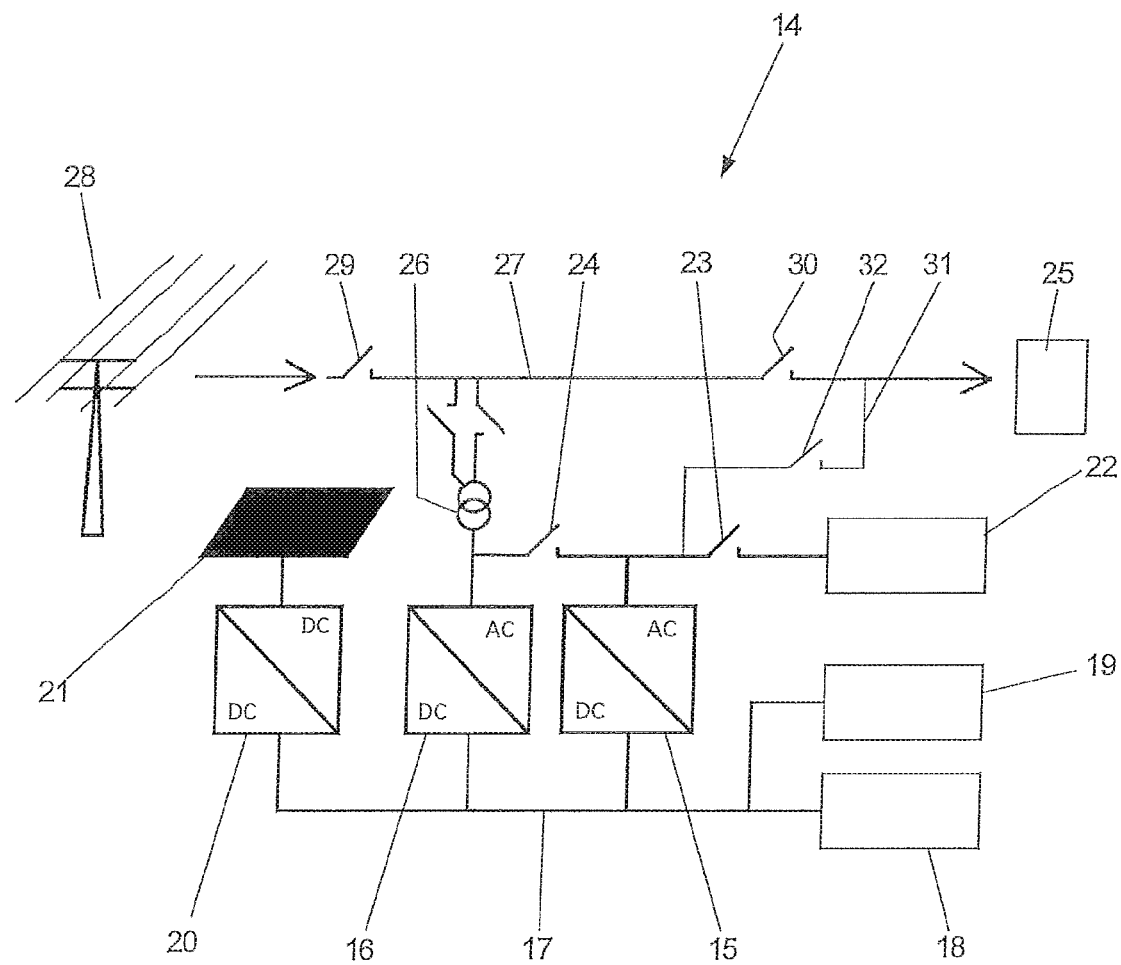

FIG. 1 shows a perspective view of a tracked vehicle according to the invention, FIG. 2 shows a side view of the tracked vehicle according to FIG. 1, FIG. 3 shows a front view of the tracked vehicle according to FIG. 1 and FIG. 4 shows a schematic representation of a power supply system according to the invention.

FIGS. 1 to 3 show a tracked vehicle 1 with a crawler chassis 2, the crawler chassis 2 comprising two parallel drive chains 3. An unspecified electric motor provides the drive of the drive chains 3. The crawler chassis 2 carries a rigid frame 4, which has a transport platform 5 extending substantially over the entire length of the tracked vehicle 1. The frame 4 is provided at the front and the rear of the vehicle 1 with laterally extendable frame members 6, at the free ends of which support feet 7 are each arranged, which are extendable in the direction of the arrow 8 against the ground.

On the frame 4, a crane structure is further arranged, comprising a boom 9 with three boom arms 10 pivotally mounted relative to each other. Furthermore, the frame 4 carries a lifting device 11 for roll-off containers.

To supply the electric drive of the crawler chassis 2, the vehicle 1 comprises two electrical energy storages 12 (FIG. 2). The electrical energy storage devices 12 feed a power electronics circuit 13 with at least one three-phase alternating current connection for external consumers.

The transport platform 5 is designed such that it can carry a schematically indicated power supply system 14. The power supply system 14 has, for example, a diesel engine and has suitable carrying hooks or the like, in order to be picked up by the loading crane 9 and lifted onto the transport platform 5 or set down from the same. The power supply system 14 has connections, not shown, via which the power supply system 14 can be connected to a charging electronics of the electrical energy storage 12 to charge them.

FIG. 4 shows a schematic representation of a power supply system 14 according to the invention. The power supply system 14 includes a bidirectional power converter 15 and an inverter 16, which are connected to a DC intermediate circuit 17. The DC intermediate circuit 17 is connected to an electrical energy storage 18, a thermoelectric generator 19 and, via a DC-DC converter 20, to a photovoltaic system 21. By a connection, not shown, the DC intermediate circuit can also be connected to an electrical energy storage 12 of the tracked vehicle 1.

On the AC side, the power supply system 14 has a generator 22 which is connected via a first switching unit 23 to the power converter 15 and, in addition via a second switching unit 24, to the inverter 16 and the load 25.

The AC side of the power converter 15 and the inverter 16 is connected via a matching transformer 26 to a line 27, via which the load 25 is supplied with electrical energy with the interposition of a fourth switching device 30. Furthermore, an external power supply grid 28 can be connected to the line 27 with the interposition of a third switching device 29. A line connection 31 functioning as a bypass line, which has a fifth switching device 32, connects the AC side of the power converter 15 between the first switching device 23 and the second switching device 24 to the line 27, the line connection 31 being connected between the switching device 30 and the load 25.

In operation, the power supply system 14 operates as follows. In the first operating mode, when the load required by the load 25 is not higher than average, the first switching unit 23 is closed and the generator 22 is connected to the electrical energy storage 18 via the power converter 15 operated as a rectifier and supplies it with current. The second switching unit 24 is open. As soon as the electrical energy storage 18 is fully charged, the generator 22 switches off. The load 25 is supplied with power by the DC intermediate circuit and possibly by the electrical energy storage 18, the thermoelectric generator 19 and the photovoltaic system 21 via the inverter 16.

If the energy required by the load is greater than the DC intermediate circuit 17 can provide, also the second switching unit 24 is closed and the power supply system switches to the second mode of operation, so that the generator 22 is connected directly, parallel to the DC intermediate circuit 17, with the load 25. Furthermore, in this state, the power converter 15 can be operated as an inverter, so that the DC intermediate circuit 17 feeds the load 25 both via the inverter 16 and via the power converter 15. As a result, the output power provided to the load 25 can be more than doubled.

As soon as the load becomes smaller, the control device opens the second switching unit 24 and the generator 22 again feeds the electrical energy storage 18 (first operating mode).

In addition, energy is generated by the photovoltaic system 21 and the thermoelectric generator 19 and introduced into the DC intermediate circuit.

The switching between the two operating modes is performed by a control device, not shown, which also controls the generator in response to the load of the electrical load.

By the possibility of switching between the first and the second operating mode, it is possible to simultaneously cover an optimum efficiency of the generator 22 in normal operation (first operating mode) and a high output power in the second operating mode.

In order to synchronize the generator 22, when starting, with the frequency of the external power supply grid 28 or with the frequency of the inverter 16, the power converter 15 can be used as an electric brake. For this purpose, the second switching device 24 is initially opened, while the first switching device 23 is closed, and the generator 22 is connected to the load 25 after synchronization by closing the second switching device 24.

Furthermore, the inverter 16 may be formed as a bidirectional power converter. This makes it possible to supply the DC intermediate circuit 17 from the external power supply grid 28 with direct current and thereby to charge the energy storage 18. This allows operation of the power supply system 14 as an uninterruptible power supply (UPS) to ensure the supply of the load 25 from the DC intermediate circuit and/or from the generator 22 in case of failure in the external power grid 28. For this purpose, the load is first supplied by the power supply network 28 with the switching devices 29 and 30 being closed, wherein, if desired, the DC intermediate circuit 17 together with the energy storage device 18 can be charged via the rectifier 15 at the same time. The switching devices 23 and 24 are open in this case. If the external power supply falls below a critical point and no longer provides sufficient energy, the switching device 29 is opened and the power supply system 14 is set to the isolated operation mode by having the DC intermediate circuit 17 supply the load 25 via the inverter 16.

In the mentioned operation as an uninterruptible power supply one can also proceed so that excess energy from the DC intermediate circuit 17 is fed back into the power grid 28, e.g. if a connected photovoltaic system 21 supplies sufficient energy.

Furthermore, a pure generator operation is possible with the power supply system 14 when the DC intermediate circuit 17 fails or the energy storage 18 is empty. In this case, the generator 22 is started with the switching devices 23, 24 and 30 being open and set to the target frequency and target voltage. Thereafter, the switching devices 23, 24 and 30 and possibly the switching devices associated to the matching transformer 26 are closed, so that the load 25 is supplied with energy. By putting the power converter 15 into operation, the AC power supplied by the generator can be kept stable, wherein the power converter 15 can be put into operation either before or after the closing of the switching device 30.

Optionally, a bypass function can be realized by having the generator 22 supply the load 25 as described above, if necessary while maintaining the power converter 15 stable, however not via the matching transformer 26, but rather via the line connection 31. In this case, the switching device 30 is open and the switching devices 29 and the switching devices associated to the matching transformer 26 are closed, so that the energy storage 18 is charged via the power converter 18 (operated as a rectifier) from the power grid 28.

The invention claimed is:

1. A power supply system comprising: an electric generator, a DC intermediate circuit, at least one rechargeable electrical energy storage, which is connected to the DC intermediate circuit, a rectifier via which the electrical generator is connectable to the DC intermediate circuit, and at least a first inverter having a DC side and an AC side, the DC side of which is supplied with direct current from the DC intermediate circuit and the AC side of which is connectable to an electrical load, and the system further comprising: a control device which regulates the electrical generator in dependence on the electrical load, characterized in that the control device is designed to switch between a first operating mode and a second operating mode of the power supply system, wherein, in the first operating mode, electrical energy generated by the electrical generator is entirely supplied via the rectifier to the DC intermediate circuit, and wherein, in the second operating mode, the generator is connected to the electrical load in parallel with the inverter.

2. The power supply system according to claim 1, characterized in that the control device is designed to switch from the first operating mode to the second operating mode, when a limit value of the electrical load is exceeded.

3. The power supply system according to claim 1, characterized in that the rectifier is designed as a bidirectional power converter, with which the control device cooperates such that the bidirectional power converter in the first operating mode is operable as a rectifier and in the second operating mode the bidirectional power converter is operable as a second inverter with a DC side and an AC side, the AC side of the second inverter being connectable to the electrical load in parallel to the first inverter.

4. The power supply system according to claim 1, characterized in that the rectifier and the first inverter are connected in parallel between the DC side and the AC side and that the electrical generator via a first switching device is connectable to an AC side of the rectifier and that between the AC side of the rectifier and the AC side of the first inverter, a second switching means is provided.

5. The power supply system according to claim 1, characterized in that the generator is configured to be driven by an internal combustion engine.

6. The power supply system according to claim 5, characterized in that a thermoelectric generator is connectable with the DC intermediate circuit.

7. The power supply system according to claim 6, characterized in that heat energy of exhaust gas from the internal combustion engine is supplied to the thermoelectric generator.

8. The power supply system according to claim 1, characterized in that a photovoltaic system is connectable with the DC intermediate circuit.

9. The power supply system according to claim 1, characterized in that the control device is designed to monitor the electrical load and, based thereon, the control device is configured to regulate voltage, current and/or frequency of the power supply system.

10. The power supply system according to claim 4, characterized in that the generator, the rectifier and the first inverter are connected via a common matching transformer to a line, via which the electrical load is configured to be supplied with electrical energy and to which, with an interposition of a third switching device, a power supply network is connectable.

11. The power supply system according to claim 10, characterized in that the electrical load is connectable to the line with the interposition of a fourth switching device.

12. The power supply system according to claim 11, characterized in that an AC side of the rectifier between the first switching device and the second switching device is connectable to the line via a line connection that is connected in parallel to a matching transformer, wherein a line connection has a fifth switching device, and wherein the line connection on a load side is separable from the matching transformer by the fourth switching device.

13. A tracked vehicle comprising a crawler chassis, a power supply system according to claim 1, an electric drive for the crawler chassis powered by the power supply system, a transport platform, and a power electronics circuit having at least one three-phase AC terminal for external loads, the transport platform being adapted to receive the power supply system.

14. The power supply system according to claim 1, wherein the electrical load is supplied via the inverter with electrical energy from the DC intermediate circuit.

15. The power supply system according to claim 8, wherein the photovoltaic system is connectable with the DC intermediate circuit by means of a DC-DC converter.

* * * * *